(12) United States Patent
Ochiai et al.

(10) Patent No.: US 11,281,058 B2
(45) Date of Patent: *Mar. 22, 2022

(54) DISPLAY DEVICE

(71) Applicant: Japan Display Inc., Tokyo (JP)

(72) Inventors: Takahiro Ochiai, Tokyo (JP);
Motoharu Miyamoto, Tokyo (JP);
Masahiro Hoshiba, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/192,436

(22) Filed: Mar. 4, 2021

(65) Prior Publication Data

US 2021/0191203 A1 Jun. 24, 2021

Related U.S. Application Data

(63) Continuation of application No. 16/171,728, filed on Oct. 26, 2018, now Pat. No. 10,969,638, which is a (Continued)

(30) Foreign Application Priority Data

Feb. 1, 2013 (JP) ................................. 2013-018188

(51) Int. Cl.
| | | |
|---|---|---|
| G02F 1/1362 | (2006.01) | |
| G02F 1/1368 | (2006.01) | |
| G02F 1/1335 | (2006.01) | |
| G02F 1/1345 | (2006.01) | |
| H01L 29/786 | (2006.01) | |

(Continued)

(52) U.S. Cl.
CPC ...... *G02F 1/136209* (2013.01); *G02F 1/1368* (2013.01); *G02F 1/13454* (2013.01); *G02F 1/133512* (2013.01); *G02F 1/136227* (2013.01); *G09G 3/3677* (2013.01); *G09G 3/3688* (2013.01); *H01L 27/124* (2013.01); *H01L 27/1222* (2013.01); *H01L 29/78609* (2013.01); *H01L 29/78633* (2013.01); *H01L 29/78669* (2013.01); *G09G 2300/0809* (2013.01); *G09G 2310/0202* (2013.01)

(58) Field of Classification Search
CPC combination set(s) only.
See application file for complete search history.

(56) References Cited

U.S. PATENT DOCUMENTS

| | | | |
|---|---|---|---|
| 6,590,229 B1 * | 7/2003 | Yamazaki | G02F 1/136213 257/71 |
| 2008/0117345 A1 * | 5/2008 | Ishii | G02F 1/136204 349/40 |

* cited by examiner

*Primary Examiner* — Lucy P Chien
(74) *Attorney, Agent, or Firm* — Michael Best & Friedrich LLP

(57) ABSTRACT

A liquid crystal display device is provided with a thin film transistor which includes a gate electrode film that is provided in a first electrode layer located over a first insulating layer, a semiconductor film that is disposed over the gate electrode film via a second insulating layer, a drain electrode and a source electrode that are provided in a second electrode layer located over the semiconductor film and are in contact with an upper surface of the semiconductor film, and a light blocking film that is disposed under the first insulating layer. At least a part thereof overlaps the semiconductor film and the gate electrode film in a plan view. One of the drain electrode and the source electrode is connected to a gate line, and the light blocking film is electrically connected to the source electrode.

8 Claims, 9 Drawing Sheets

Related U.S. Application Data continuation of application No. 15/641,403, filed on Jul. 5, 2017, now Pat. No. 10,146,095, which is a continuation of application No. 15/251,531, filed on Aug. 30, 2016, now Pat. No. 9,726,951, which is a continuation of application No. 14/749,132, filed on Jun. 24, 2015, now Pat. No. 9,459,503, which is a continuation of application No. 14/168,062, filed on Jan. 30, 2014, now Pat. No. 9,104,077.

(51) Int. Cl.
  *G09G 3/36* (2006.01)
  *H01L 27/12* (2006.01)

DISPLAY DEVICE

CROSS REFERENCE TO RELATED APPLICATIONS

This application is a continuation of U.S. patent application Ser. No. 16/171,728, filed on Oct. 26, 2018, which, in turn, is a continuation of U.S. patent application Ser. No. 15/641,403 (now U.S. Pat. No. 10,146,095), filed on Jul. 5, 2017, which, in turn, is a continuation of U.S. patent application Ser. No. 15/251,531 (now U.S. Pat. No. 9,726,951), filed on Aug. 30, 2016, which, in turn, is a continuation of U.S. patent application Ser. No. 14/749,132 (now U.S. Pat. No. 9,459,503), filed on Jun. 24, 2015, which, in turn, is a continuation of U.S. patent application Ser. No. 14/168,062 (now U.S. Pat. No. 9,104,077), filed on Jan. 30, 2014. Further, this application claims priority from Japanese Patent Application No. 2013-018188 filed on Feb. 1, 2013, the entire contents of which are hereby incorporated by reference into this application.

BACKGROUND OF THE INVENTION

1. Field of the Invention

The present invention relates to a liquid crystal display device.

2. Description of the Related Art

A liquid crystal display panel includes an array substrate having a display region and a frame region. A plurality of pixel circuits are disposed on the display region. The frame region located around the display region. A plurality of thin film transistors are formed on the array substrate. At least a part of a semiconductor film formed on the array substrate forms a channel of each thin film transistor, and the fact is known that light from a backlight enters the semiconductor film and produces a leakage current. In order to prevent this leakage current, a light blocking film may be provided under a gate electrode. The light blocking film is disposed to prevent light from the backlight from entering the semiconductor film.

JP2011-238835A discloses a thin film transistor in which a light blocking film is provided under a gate electrode, and an insulating film is provided between the gate electrode and the light blocking film, and a liquid crystal display device using the thin film transistor.

In order to miniaturize a liquid crystal display device while securing a display region, it is necessary to narrow a frame region around the display region. In addition, in recent years, a gate line driving circuit including many thin film transistors has been formed in the frame region. If the frame region is to be narrowed, it is necessary to miniaturize the gate line driving circuit. On the other hand, there are cases where, when the light blocking film is provided, a reaction of the thin film transistor to a signal applied to the gate electrode gets worse.

SUMMARY OF THE INVENTION

The present invention has been made in view of the above-described problems, and an object thereof is to provide a technique of enabling a gate line driving circuit to be miniaturized. In addition, another object of the present invention is to provide a technique of enabling a thin film transistor to more reliably react to a signal applied to a gate electrode than in a case where the present configuration is not employed.

Among the inventions disclosed in the present application, a brief description of an outline of representative inventions is made as follows.

(1) A liquid crystal display device including a pixel; a pixel transistor; an image signal line that supplies an image signal to the pixel; a scanning signal line that supplies a control signal to the pixel; and an output transistor that outputs the control signal to the scanning signal line, in which the output transistor includes a gate electrode film that is provided in a first electrode layer located over a first insulating layer; a semiconductor film that is disposed above the gate electrode film via a second insulating layer; a drain electrode that is provided in a second electrode layer located over the semiconductor film and is in contact with a part of an upper surface of the semiconductor film; a source electrode that is provided in the second electrode layer and is in contact with a part of the upper surface of the semiconductor film; and a light blocking film that is disposed under the first insulating layer and is provided so that at least a part thereof overlaps the semiconductor film and the gate electrode film in a plan view, in which one of the drain electrode and the source electrode is connected to the scanning signal line, and, in which the light blocking film is a metal film, and is electrically connected to the source electrode.

(2) The liquid crystal display device according to (1), in which the other of the drain electrode and the source electrode is connected to a clock signal line which supplies a periodic pulse.

(3) The liquid crystal display device according to (1) or (2), in which the gate electrode is connected to a wiring in the second electrode layer via a first hole which penetrates through the second insulating layer, and in which the light blocking film is connected to the source electrode via a second hole which penetrates through the first and second insulating layers.

(4) A liquid crystal display device including a first substrate; a pixel formed on the first substrate; a pixel transistor formed in the pixel; an image signal line that supplies an image signal to the pixel transistor; a scanning signal line that supplies a control signal for controlling turning-on and turning-off of the pixel transistor; and an output transistor that outputs the control signal to the scanning signal line, in which the output transistor includes a light blocking film that is formed on the first substrate; a first insulating layer that is formed on the light blocking film; a gate electrode film that is provided in a first electrode layer located over the first insulating layer; a semiconductor film that is disposed above the gate electrode film via a second insulating layer; a drain electrode that is provided in a second electrode layer located over the semiconductor film and is in contact with a part of an upper surface of the semiconductor film; and a source electrode that is provided in the second electrode layer and is in contact with a part of the upper surface of the semiconductor film, in which the light blocking film is provided so that at least a part thereof overlaps the semiconductor film and the gate electrode film in a plan view, in which one of the drain electrode and the source electrode is connected to the scanning signal line, and in which the light blocking film is a metal film, and is electrically connected to the source electrode.

(5) The liquid crystal display device according to (4), in which the other of the drain electrode and the source electrode is connected to a clock signal line which supplies a periodic pulse.

(6) The liquid crystal display device according to (4) or (5), in which the gate electrode is connected to a wiring in the second electrode layer via a first hole which penetrates through the second insulating layer, and in which the light blocking film is connected to the source electrode via a second hole which penetrates through the first and second insulating layers.

(7) A manufacturing method of a liquid crystal display device, including forming a light blocking film including a metal; forming a first insulating layer on the light blocking film; forming a gate electrode film at least a part of which overlaps the light blocking film in a plan view, on the first insulating layer; forming a second insulating layer on the gate electrode film; forming a first hole which penetrates through the second insulating layer and reaches the gate electrode film and a second hole which penetrates through the first and second insulating layers and reaches the light blocking film through etching at one time; forming a semiconductor film at least a part of which overlaps the gate electrode film in a plan view, on the second insulating layer; and forming a layer including a drain electrode which is in contact with an upper surface of the semiconductor film, a source electrode which is in contact with the upper surface of the semiconductor film and is in contact with the light blocking film at the second hole, and a wiring which is in contact with the gate electrode film at the first hole.

According to the present invention, it is possible to miniaturize a gate line driving circuit. In addition, it is possible to enable a thin film transistor to more reliably react to a signal applied to a gate electrode than in a case of not employing the present configuration.

DETAILED DESCRIPTION OF THE INVENTION

Figure 1:
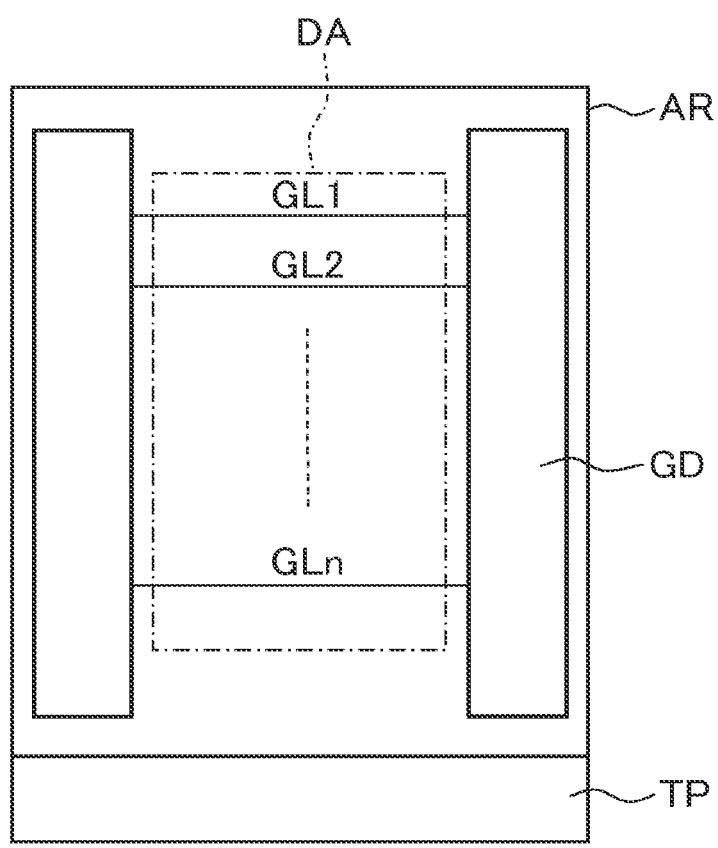
FIG. 1 is a diagram illustrating an example of a circuit arrangement in an array substrate according to an embodiment of the present invention.

Hereinafter, an embodiment of the present invention will be described with reference to the drawings. Among the illustrated constituent elements, the constituent elements having the same function are given the same reference character, and the description thereof will be omitted.

A liquid crystal display device according to the embodiment of the present invention includes an array substrate AR, a counter substrate which opposes the array substrate and is provided with color filters, a liquid crystal material which is sealed in a region interposed between the substrates, and a backlight which applies light from outside of the array substrate.

Figure 2:
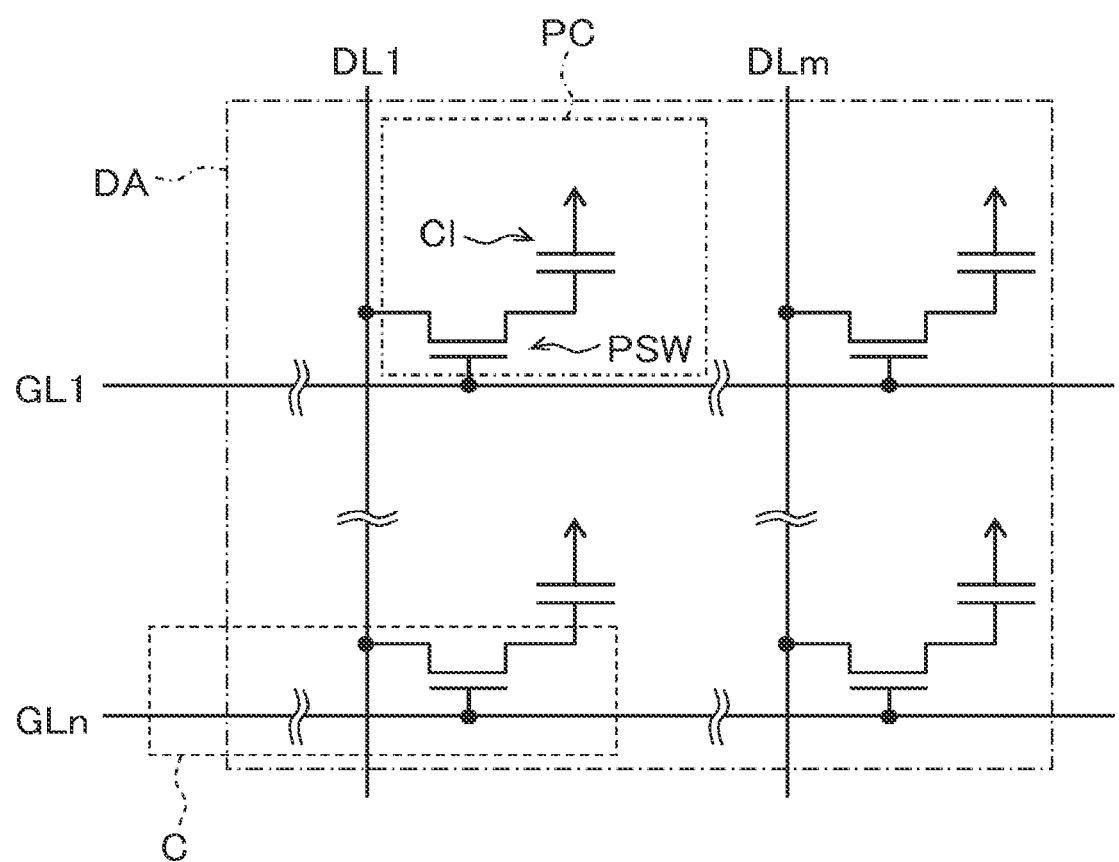
FIG. 2 is a circuit diagram illustrating an example of an equivalent circuit of a pixel circuit in a display region.

FIG. 1 is a diagram illustrating an example of a circuit arrangement in the array substrate AR according to the embodiment of the present invention, and FIG. 2 is a circuit diagram illustrating an example of an equivalent circuit of a pixel circuit PC located in a display region DA. The array substrate AR is provided with the display region DA, gate line driving circuits GD provided in the left and right sides of the display region, and a terminal portion TP including terminals connected to a flexible printed board and the like. The n rows×m columns of the pixel circuits PC are disposed in the display region DA.

In the display region DA, n gate lines GL and m data lines DL extend. The n gate lines GL respectively correspond to the rows of the pixel circuits PC, and extend in the lateral direction of FIGS. 1 and 2. At least one of both ends of the gate line GL is connected to the gate line driving circuit GD. The m data lines DL respectively correspond to the columns of the pixel circuits PC, and extend in the vertical direction of FIG. 2. Hereinafter, the gate line GL corresponding to the k-th row of the pixel circuit PC is indicated by GLk, and the data line DL corresponding to the i-th column of the pixel circuit PC is indicated by DLi.

Each pixel circuit PC includes a pixel switch PSW and a liquid crystal capacitor C1. The pixel switch PSW, which is a thin film transistor, is provided between the liquid crystal capacitor C1 and the data line DL, and connects the liquid crystal capacitor C1 to the data line DL in response to an ON signal supplied from the gate line GL. The liquid crystal capacitor C1 is formed by a pixel electrode, a common electrode, and liquid crystal interposed therebetween. The liquid crystal capacitor C1 stores a potential difference based on a signal supplied from the data line DL. In addition, the pixel electrode is connected to the pixel switch PSW, and a potential which is defined regardless of a signal supplied to the data line DL is supplied to the common electrode.

An extent of polarization of the liquid crystal changes on the basis of the potential difference stored by the liquid crystal capacitor C1, and thus an amount of light which passes through the pixel circuit PC also changes. Accordingly, the liquid crystal display device displays an image. In addition, details of a circuit C surrounded by the broken line will be described later.

Figure 3:
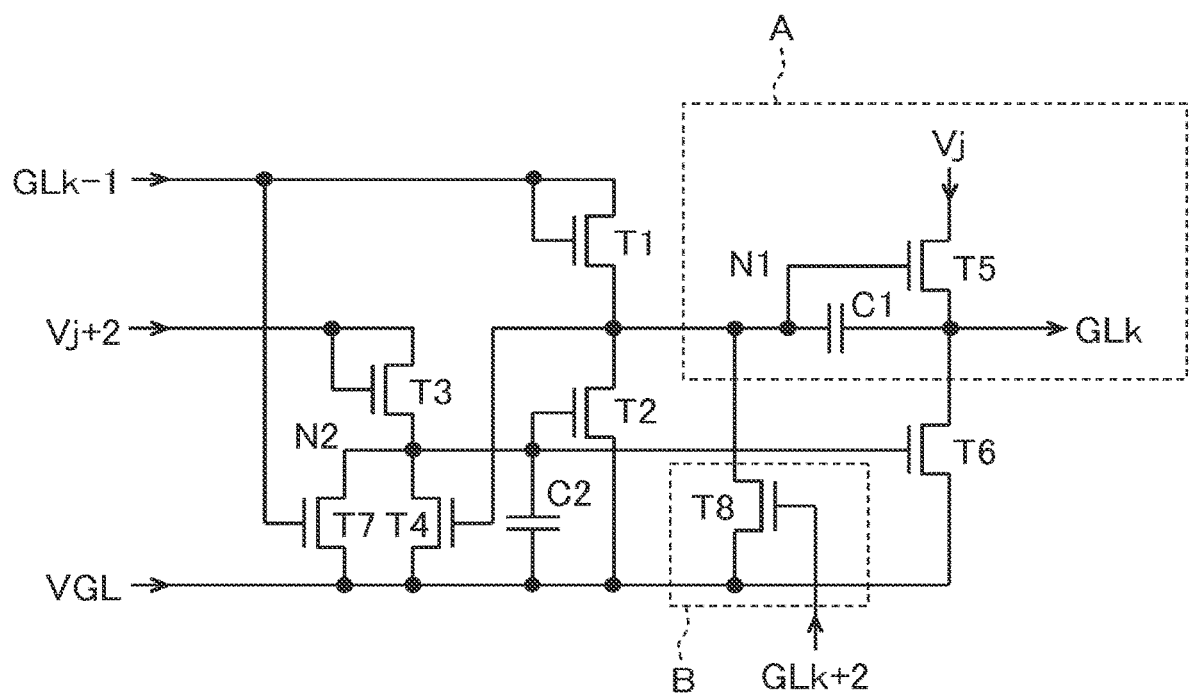
FIG. 3 is a circuit diagram illustrating an example of an equivalent circuit of a gate line driving circuit.

FIG. 3 is a diagram illustrating an example of an equivalent circuit of the gate line driving circuit GD. FIG. 3 illustrates a part (hereinafter, referred to as a line circuit) in the gate line driving circuit GD. The part supplies an ON signal to the k-th gate line GL. In FIG. 3, for example, the arrow extending from GLk−1 indicates that a signal is input from the gate line GLk−1, and the arrow extending toward GLk indicates that a signal is output to the gate line GLk. The gate line driving circuit GD is connected to four clock signal lines V1 to V4, and the clock signal lines V1 to V4 supply pulse signals in order of numbers thereof. In addition, the number of clock signal lines may be not four, and may be three or more. Further, j of Vj in FIG. 3 is a remainder, for example, obtained by dividing k by 4. For convenience of description, it is assumed that V1 indicates a case where j+2 of Vj+2 is 5, and V2 indicates a case where j+2 is 6.

The line circuit includes eight thin film transistors T1 to T8, and two capacitors C1 and C2. The thin film transistor T5 controls whether or not a clock supplied from the clock signal line Vj is supplied to the gate line GLk as an ON signal. A gate electrode of the thin film transistor T5 is connected to a node N1 of the line circuit. The thin film transistor T5 is turned on if a potential of the node N1 is turned to a high level, and supplies a potential of a clock which is supplied to a drain electrode thereof during this time, to the gate line GLk. The clock is a periodic pulse, and has a high level potential at a timing when the line circuit sends an ON signal to the gate line GLk. The capacitor C1 is connected between the source electrode and the gate electrode of the thin film transistor T5. If a potential of the gate line GLk is turned to a high level, a potential of the node N1 is further increased by the capacitor C1 than before, and a pulse shape of the clock is clearer than in a case of not using the capacitor C1. The capacitor C1 is a so-called charge pump capacitor.

The node N1 is connected to a source electrode of the diode-connected thin film transistor T1, and drain electrodes of the thin film transistors T2 and T8. A gate electrode and a drain electrode of the thin film transistor T1 are connected to the gate line GLk−1. Thus, if a potential of the gate line GLk−1 is turned to a high level, the thin film transistor T1 inputs a high level potential to the node N1, and, in turn, a potential of the node N1 is turned to a high level. A gate electrode of the thin film transistor T2 is connected to a node N2, and a source electrode thereof is connected to a ground line VGL which supplies a low level reference potential. The thin film transistor T2 maintains a potential of the node N1 in a low level during a period when the node N2 is in a high level (a period excluding a horizontal period 1H when an ON signal is supplied to the gate line GLk and both horizontal periods before and after the horizontal period 1H).

A gate electrode of the thin film transistor T6 is connected to the node N2, a drain electrode thereof is connected to the gate line GLk, and a source electrode thereof is connected to the ground line VGL. The thin film transistor T6 is turned on during a period when the node N2 is in a high level, and maintains a potential of the gate line GLk in a low level.

One end of the capacitor C2 is connected to the node N2, and the other end thereof is connected to the ground line VGL, thereby maintaining a potential of the node N2. In addition, the thin film transistor T3 is diode-connected, and supplies a high level potential which is input as a clock from the clock signal line Vj+2, to the node N2. In this way, a potential of the node N2 is maintained in a high level during a period excluding the horizontal period 1H when an ON signal is supplied to the gate line GLk and both horizontal periods before and after the horizontal period 1H.

Drain electrodes of the thin film transistors T4 and T7 are connected to the node N2, and source electrodes thereof are connected to the ground line VGL. A gate electrode of the thin film transistor T4 is connected to the node N1. The thin film transistor T4 is turned on when a potential of the node N1 is turned to a high level by an ON signal from the gate line GLk−1, so as to turn a potential of the node N2 to a low level. In addition, a gate electrode of the thin film transistor T7 is connected to the gate line GLk−1. The thin film transistor T7 changes a potential of the node N2 from a high level to a low level without delay when a potential of the node N1 is turned from a low level to a high level.

A gate electrode of the thin film transistor T8 is connected to the gate line GLk+2. The thin film transistor T8 changes a potential of the node N1 from a high level to a low level without delay when a potential of the node N2 is turned from a low level to a high level.

Hereinafter, a structure of a circuit mounted on the array substrate AR will be described. In the circuit illustrated in FIG. 3, a part where the thin film transistor T5 is connected to the capacitor C1 is referred to as a circuit A, and a part corresponding to the thin film transistor T8 is referred to as a circuit B.

Figure 4:
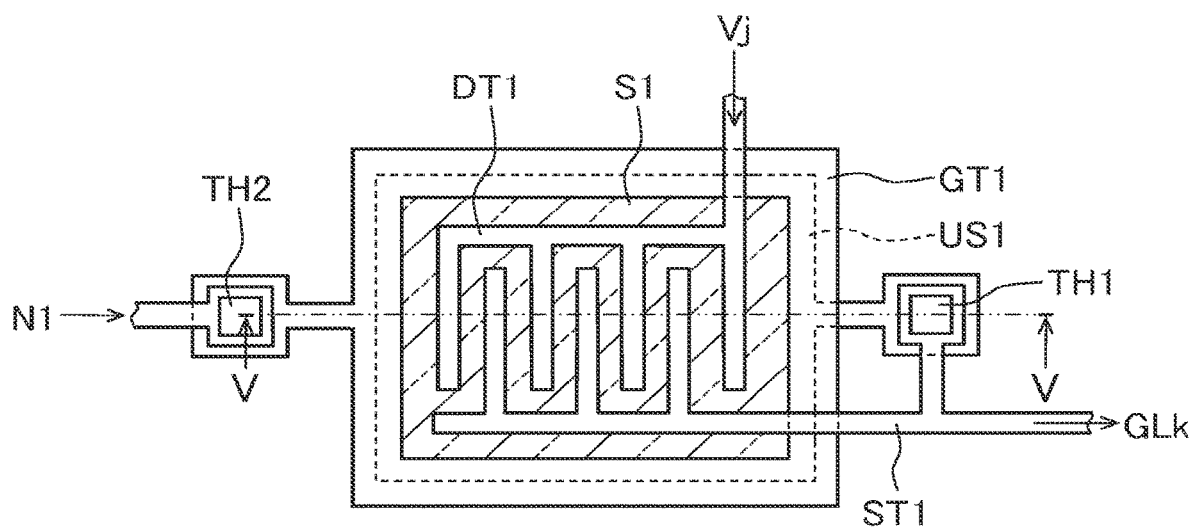
FIG. 4 is a plan view illustrating a structure of a circuit A.
Figure 5:
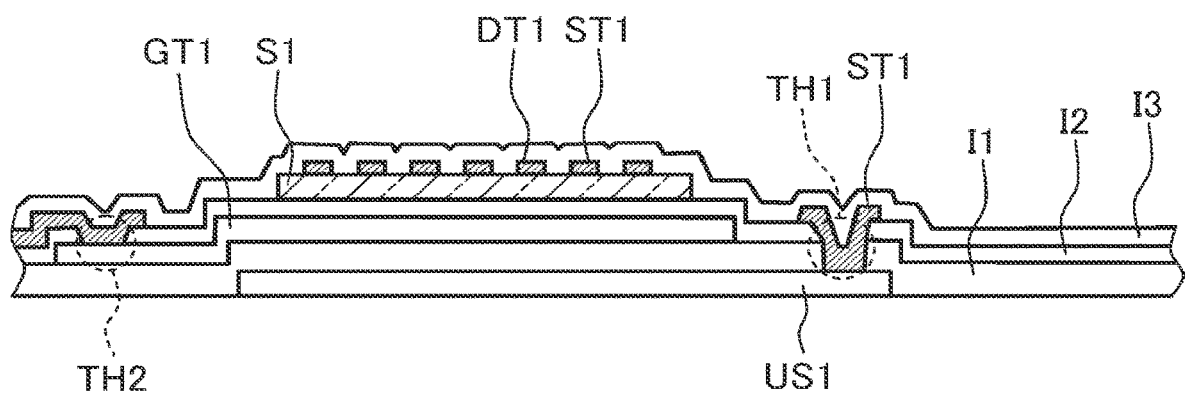
FIG. 5 is a cross-sectional view taken along the line V-V of FIG. 4.

FIG. 4 is a plan view illustrating a structure of the circuit A, and FIG. 5 is a cross-sectional view taken along the line V-V of FIG. 4. The array substrate AR is a rectangular glass substrate which is transparent. A light blocking film US1 is formed on the array substrate AR so as to be in contact with an upper surface of the array substrate AR. In a plan view, the light blocking film US1 has a rectangular part which is a little larger than a rectangular semiconductor film S1 described later, and a connection part which extends from the rectangular part to a lower layer of a through-hole TH1. The light blocking film US1 overlaps the entirety of the semiconductor film S1 in a plan view, and thus light toward the semiconductor film S1 from the backlight is reflected by the light blocking film US1.

A first insulating layer I1 formed of an insulating film which covers the light blocking film US1 is formed on the light blocking film US1. A first electrode layer in which a gate electrode GT1 of the thin film transistor T5 is formed is provided on the first insulating layer I1. The gate electrode GT1 includes, in a plan view, a rectangular part which is a little larger than the overlying semiconductor film S1 and a connection part which extends from the rectangular part to a lower layer of a through-hole TH2. The gate electrode GT1 entirely overlaps the semiconductor film S1 in a plan view. In FIG. 4, the rectangular part of the gate electrode GT1 is a little larger than the semiconductor film S1 or the rectangular part of the light blocking film US1, but may not necessarily be so.

A second insulating layer I2 which is formed of an insulating film is formed on the gate electrode GT1. The semiconductor film S1 is formed on the second insulating layer I2. As described above, the semiconductor film S1 is a little smaller than the gate electrode GT1 and the light blocking film US1, and overlaps the gate electrode and the light blocking film in a plan view.

A second electrode layer is provided on the semiconductor film S1. The second electrode layer includes a drain electrode DT1, a source electrode ST1 and wiring for connecting the gate electrode GT1 of the thin film transistor T5 to the node N1. Each of the drain electrode DT1 and the source electrode ST1 has a comb teeth shape. More specifically, each of the drain electrode DT1 and the source electrode ST1 includes a plurality of linear parts which extend in the vertical direction of FIG. 4, and the linear parts of the source electrode ST1 are disposed between the linear parts of the drain electrode DT1 which are adjacent to each other. Upper ends of the plurality of linear parts of the drain electrode DT1 are connected to each other via a part which extends in the lateral direction, and lower ends of the plurality of linear parts of the source electrode ST1 are also connected to each other via a part which extends in the lateral direction. In addition, the part of the source electrode ST1 extending in the lateral direction is electrically connected to the gate line GLk. Further, the source electrode ST1 branches out in the middle and extends up to the through-hole TH1, and is in contact with the light blocking film US1 via the through-hole TH1. The through-hole TH1 is formed by holes provided in the insulating films of the first insulating layer I1 and the second insulating layer I2, and a bottom thereof is the light blocking film US1. Furthermore, the wiring of the node N1 is in contact with the gate electrode GT1 via the through-hole TH2. The through-hole TH2 is formed of a hole provided in the insulating film of the second insulating layer I2, and a bottom thereof is the gate electrode GT1.

The drain electrode DT1, the source electrode ST1, and the like of the thin film transistor T5 described hitherto are covered by a third insulating layer I3.

Here, the gate electrode GT1 and the light blocking film US1 serve as the capacitor C1 with the first insulating layer I1 interposed therebetween. This is because the source electrode ST1 is electrically connected to the light blocking film US1. As above, the light blocking film US1 is used as a member of the capacitor so as to form a so-called charge pump capacitor, and thus it is possible to further reduce a circuit area than in a case of providing the capacitor C1 in other regions.

For example, if a dielectric constant of the first insulating layer I1 is 6.8, a film thickness is 200 nm, and a necessary capacitance is 1.6 pF, an area required as the capacitor C1 is $5.32 \times 10^{-3}$ μm². This indicates that, in terms of simple calculation, if a pitch between the gate lines GL is 90 μm, a length in a direction perpendicular thereto can be reduced by 59 μm.

Figure 6:
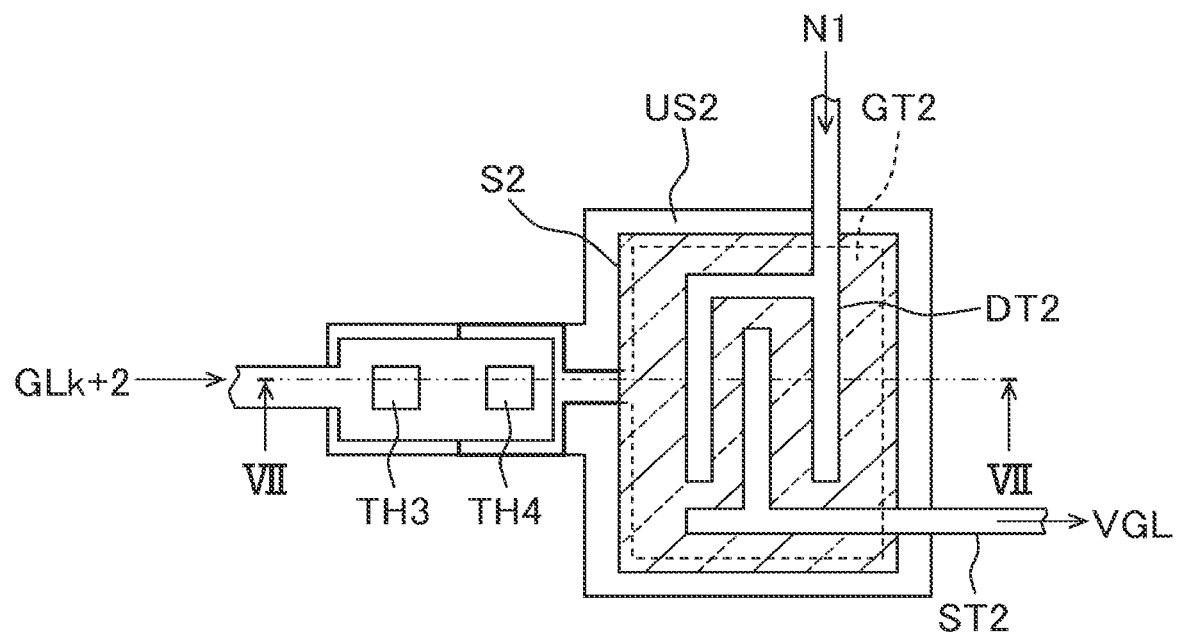
FIG. 6 is a plan view illustrating a structure of a circuit B.
Figure 7:
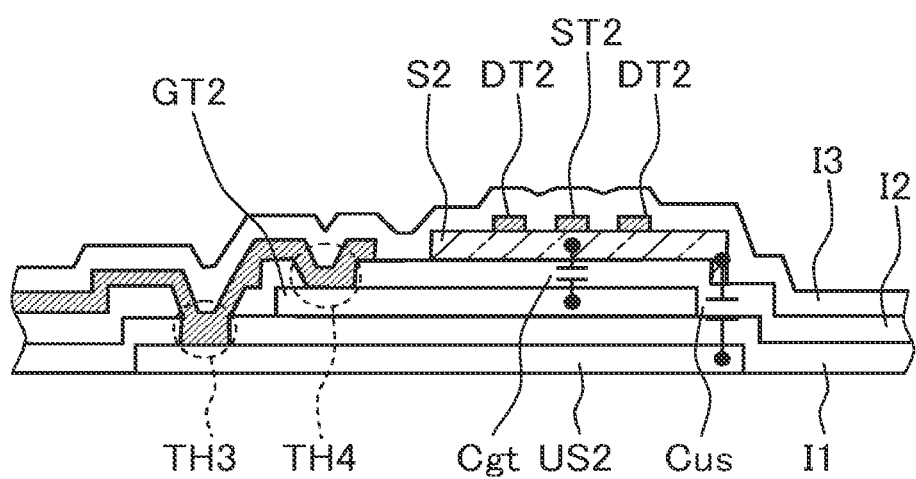
FIG. 7 is a cross-sectional view taken along the line VII-VII of FIG. 6.

FIG. 6 is a plan view illustrating a structure of the circuit B, and FIG. 7 is a cross-sectional view taken along the line VII-VII of FIG. 6. A light blocking film US2 is formed on the array substrate AR so as to be in contact with an upper surface of the array substrate AR. In a plan view, the light blocking film US2 has a rectangular part which is a little larger than a rectangular semiconductor film S2 described later, and a connection part which extends from the rectangular part to a bottom of a through-hole TH3 in the left direction of FIG. 6. The light blocking film US2 overlaps the entirety of the semiconductor film S2 in a plan view, and thus light from the backlight does not enter the semiconductor film S2.

A first insulating layer I1 is formed on the light blocking film US2. A first electrode layer is provided on the first insulating layer I1. A gate electrode GT2 of the thin film transistor T8 is formed in the first electrode layer. The gate electrode GT2 includes, in a plan view, a rectangular part which is a little smaller than the overlying semiconductor film S2 and a connection part which extends from the rectangular part to a lower layer of a through-hole TH4 in the left direction of FIG. 6. The gate electrode GT2 overlaps a part of the semiconductor film S2 in a plan view. Here, in a plan view, the gate electrode GT2 is located in a region of the light blocking film US2 and the through-hole TH4 is located in the region. In addition, the through-hole TH3 is located further toward the left than the through-hole TH4, and the gate electrode GT2 does not extend to the lower side of the through-hole TH3.

A second insulating layer I2 is formed on the gate electrode GT2. The semiconductor film S2 is formed on the second insulating layer I2. As described above, the semiconductor film S2 is a little larger than the gate electrode GT2 and is a little smaller than the light blocking film US2.

A second electrode layer is provided on the semiconductor film S2. The second electrode layer includes a drain electrode DT2, a source electrode ST2 of the thin film transistor T8 and wiring for electrically connecting the gate electrode GT2 of the thin film transistor T8 and the light blocking film US2 to the gate line GLk+2. The drain electrode DT2 has two linear parts which extend in the vertical direction of FIG. 6, and the source electrode ST2 also has a single linear part extending in the vertical direction thereof. The linear part of the source electrode ST2 is disposed between the linear parts of the drain electrode DT2 which are adjacent to each other. The linear parts of the drain electrode DT2 are connected to each other at upper ends thereof, and a lower end of the linear part of the source electrode ST2 is connected to a part which extends in the lateral direction. The drain electrode DT2 is electrically connected to the node N1, and the source electrode ST2 is electrically connected to the ground line VGL.

The above-described wiring is in contact with the light blocking film US2 via the through-hole TH3, and are in contact with the gate electrode GT2 via the through-hole TH4. The through-hole TH3 is formed by holes provided in the insulating films of the first insulating layer I1 and the second insulating layer I2, and a bottom thereof is the light blocking film US2. The through-hole TH4 is formed of a hole provided in the insulating film of the second insulating layer I2, and a bottom thereof is the gate electrode GT2.

The drain electrode DT2, the source electrode ST2, and the like of the thin film transistor T8 described hitherto are covered by a third insulating layer I3 provided thereon.

In the thin film transistor T8, a parasitic capacitor Cgt is generated between the semiconductor film S2 and the gate electrode GT2, and a parasitic capacitor Cus is generated between the semiconductor film S2 and the light blocking film US2. On the other hand, the gate electrode GT2 and the light blocking film US2 are electrically connected to each other and thus have the same potential when an internal resistance is disregarded. Therefore, the capacitors generated between the gate electrode and the light blocking film are not problematic. Here, only the second insulating layer I2 is provided between the semiconductor film S2 and the gate electrode GT2, but the first insulating layer I1 and the second insulating layer I2 are provided between the semiconductor film S2 and the light blocking film US2. Therefore, a capacitance Cus per unit area is smaller than a capacitance Cgt per unit area. Accordingly, an area of the gate electrode GT2 is made as small as possible, and the semiconductor film S2 is covered by the light blocking film US2 which is electrically connected to the gate electrode GT2, thereby reducing the parasitic capacitors Cgt and Cus generated in the thin film transistor T8. Thus, it is possible to improve a switching speed when a signal for turning on the thin film transistor T8 is supplied to the gate electrode GT2.

Figure 8:
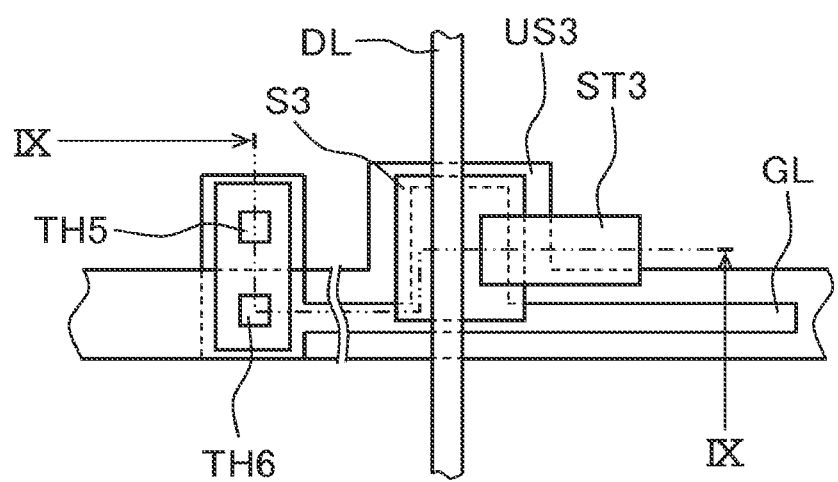
FIG. 8 is a plan view illustrating a structure of a pixel switch and a gate line.
Figure 9:
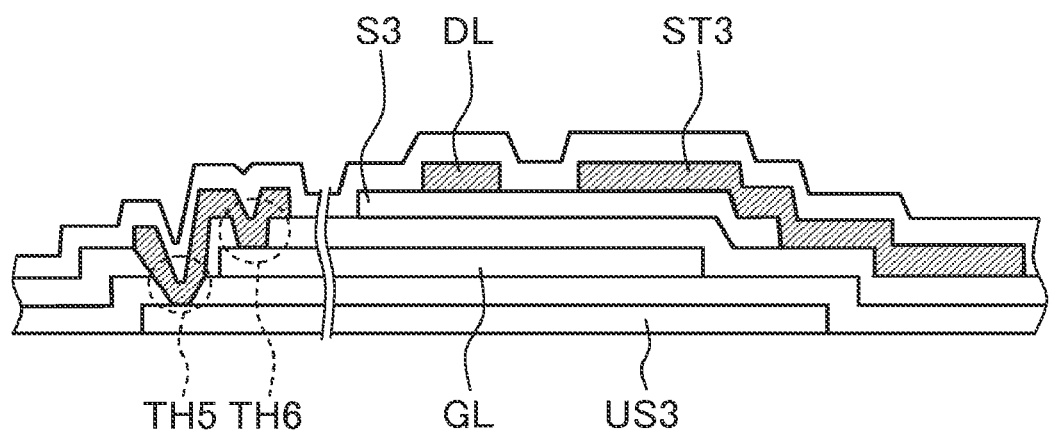
FIG. 9 is a cross-sectional view taken along the line IX-IX of FIG. 8.

FIG. 8 is a plan view illustrating a structure of the pixel switch PSW and the gate line GL (circuit C). FIG. 9 is a cross-sectional view taken along the line IX-IX of FIG. 8. Right parts of FIGS. 8 and 9 indicate a structure of the data line DL and the pixel switch PSW located in the display region DA, and left parts of FIGS. 8 and 9 indicate a structure in which the gate line GL is connected to a light blocking film US3 outside the display region DA.

The light blocking film US3 is formed on the array substrate AR so as to be in contact with an upper surface of the array substrate AR. The light blocking film US3 has a strip-shaped part which extends in the lateral direction of FIG. 8, a part which is expanded from the strip-shaped part and overlaps an entirety of a semiconductor film S3 described later in a plan view, and a part which is bent upward outside the display region DA in FIG. 8 and extends up to a bottom of a through-hole TH5. The light blocking film US3 is formed so that light from the backlight does not enter the semiconductor film S3.

A first insulating layer I1 is formed on the light blocking film US3. A first electrode layer is provided on the first insulating layer I1. The first electrode layer includes a gate line GL which extends in the lateral direction over the light blocking film US3. The gate line GL has a part which is expanded under the semiconductor film S3. The expanded part is substantially rectangular, and is a little smaller than the semiconductor film S3 and overlaps the semiconductor film S3 in a plan view. The expanded part also serves as a gate electrode of the pixel switch PSW.

A second insulating layer I2 is formed on the gate line GL. The semiconductor film S3 is formed on the second insulating layer I2. The semiconductor film S3 is a little larger than the expanded part of the gate line GL and is a little smaller than the expanded part of the light blocking film US3.

A second electrode layer is provided on the semiconductor film S3. The second electrode layer includes the data line DL, a source electrode ST3 and wiring for connecting the gate line GL to the light blocking film US3 via through-holes TH5 and TH6. The data line DL also serves as a drain electrode of the pixel switch PSW, and a part thereof is in contact with an upper surface of a part of the semiconductor film S3 in a plan view. A part of the source electrode ST3 is in contact with an upper surface of a part of the semiconductor film S3 in a plan view, and is also connected to the pixel electrode although not illustrated.

The above-described wiring is in contact with the light blocking film US3 at a bottom of the through-hole TH5, and are in contact with the gate line GL at a bottom of the through-hole TH6. The through-hole TH5 is formed by holes provided in the insulating films of the first insulating layer I1 and the second insulating layer I2, and the bottom thereof is the light blocking film US3. The through-hole TH6 is formed of a hole provided in the insulating film of the second insulating layer I2, and the bottom thereof is the gate line GL.

The data line DL, the source electrode ST3, and the like described hitherto are covered by a third insulating layer I3 provided thereon. In addition, the common electrode or the pixel electrode (not illustrated) which is a transparent conductive layer is formed on the third insulating layer I3.

In the pixel switch PSW of the circuit C, the gate line GL corresponding to a gate electrode is electrically connected to the light blocking film US3 in the same manner as in the circuit B. Therefore, a parasitic capacitor generated in the pixel switch PSW can be reduced, and thus it is possible to improve a switching speed when a signal for turning on the pixel switch PSW is supplied to the gate electrode thereof.

Next, a manufacturing method of the circuits will be described. First, a metal film such as a Mo alloy is formed on the array substrate AR by sputtering, and the light blocking films US1 to US3 and the like are patterned by etching. Next, a silicon nitride film is formed using a CVD device so as to form the first insulating layer I1. A metal such as a Mo alloy is sputtered on the first insulating layer I1 so as to form the first electrode layer, and the gate line GL and the gate electrodes GT1 and GT2 are formed by etching. In addition, a silicon nitride film is formed using a CVD device so as to form the second insulating layer I2, and then an amorphous silicon film is formed so as to form a semiconductor layer.

The semiconductor films S1 to S3 are formed by etching the semiconductor layer, and the through-holes TH1 to TH6 are formed by etching the first insulating layer I1 and the second insulating layer I2. The etching of the first insulating layer I1 and the second insulating layer I2 is performed at one time so that the through-hole TH2 and the like formed on the gate electrode GT1 and the like are formed by holes which penetrate through only the second insulating layer I2, and the through-hole TH1 and the like formed on the light blocking film US1 and the like are formed by holes which penetrate through the first insulating layer I1 and the second insulating layer I2.

Next, a metal film such as a Mo alloy is formed by sputtering, and the drain electrodes DT1 and DT2, and wirings such as the data lines DL are formed through etching. Due to this process, wirings and the like of the second electrode layer are connected to wirings located at the bottoms of the through-holes TH1 to TH6. A silicon nitride film is formed and etched so as to form the third insulating layer I3 thereon.

Further, a transparent conductive film is formed through sputtering, and the common electrode (not illustrated) is formed by etching the transparent conductive film, and the third insulating layer I3 is formed thereon by forming and etching a silicon nitride film. In addition, a transparent conductive film is formed on the third insulating layer I3 through sputtering, and the pixel electrode is formed by etching the transparent conductive film.

Due to these steps, the gate line driving circuits GD, the pixel circuits PC, and the like are formed on the array substrate AR. A counter substrate is joined to the array substrate AR, and a gap between the array substrate AR and the counter substrate is filled with liquid crystal. In addition, the array substrate AR is connected to circuits or wirings of a flexible printed board or the like, thereby forming a liquid crystal display panel.

While there have been described what are at present considered to be certain embodiments of the invention, it will be understood that various modifications may be made thereto, and it is intended that the appended claims cover all such modifications as fall within the true spirit and scope of the invention.

What is claimed is:

1. A display device comprising:
a substrate;
a pixel provided on the substrate;
a pixel transistor provided in the pixel;
an image signal line supplying an image signal to the pixel transistor;
a scanning signal line supplying a control signal to the pixel transistor; and
an output transistor provided on the substrate and outputting the control signal to the scanning signal line,
wherein the display device has a display area where the pixel is disposed, and a peripheral area surrounding the display area,
wherein the output transistor is disposed in the peripheral area,
wherein the output transistor includes a gate electrode, a semiconductor film, a drain electrode, and a source electrode,
wherein the gate electrode overlaps the semiconductor film in a plan view,
wherein an outer edge of the semiconductor film is inside an outer edge of the gate electrode in the plan view,
wherein the source electrode is electrically connected to the scanning signal line,
wherein, in the plan view, the gate electrode overlaps a first metal which electrically connected to the source electrode by a through hole,
wherein a capacitor is formed between the first metal and the gate electrode, and
wherein the through hole is between the output transistor and the display area.

2. The display device according to claim 1,
wherein the drain electrode is connected to a clock signal line which supplies a periodic pulse.

3. The display device according to claim 1,
wherein the outer edge of the semiconductor film is covered by a light shielding film, and
the light shielding film is the first metal.

4. The display device according to claim 3,
wherein the gate electrode is between the first metal and the semiconductor film.

5. A display device comprising:
a substrate;
a pixel provided on the substrate;
a pixel transistor provided in the pixel;
an image signal line supplying an image signal to the pixel transistor;
a scanning signal line supplying a control signal to the pixel transistor; and
an output transistor provided on the substrate and outputting the control signal to the scanning signal line,
wherein the display device has a display area where the pixel is disposed, and a peripheral area surrounding the display area,
wherein the output transistor is disposed in the peripheral area,
wherein the output transistor includes a gate electrode, a semiconductor film, a drain electrode, and a source electrode,
wherein the gate electrode overlaps the semiconductor film in a plan view,
wherein an outer edge of the semiconductor film is inside an outer edge of the gate electrode in the plan view,
wherein the source electrode is electrically connected to the scanning signal line,
wherein, in the plan view, the gate electrode overlaps a first metal which electrically connected to the source electrode by a through hole,
wherein a capacitor is formed between the first metal and the gate electrode, and
wherein the through hole is between the output transistor and the display area.

6. The display device according to claim 5,
wherein the drain electrode is connected to a clock signal line which supplies a periodic pulse.

7. The display device according to claim 5,
wherein the outer edge of the semiconductor film is covered by a light shielding film, and
the light shielding film is the first metal.

8. The display device according to claim 7,
wherein the gate electrode is between the first metal and the semiconductor film.

* * * * *